US012783781B2

(12) United States Patent
Hamouda

(10) Patent No.: US 12,783,781 B2
(45) Date of Patent: Nov. 3, 2026

(54) VERIFYING FREEFORM CURVILINEAR FEATURES OF A MASK DESIGN

(71) Applicant: ASML NETHERLANDS B.V., Veldhoven (NL)

(72) Inventor: Ayman Hamouda, Milpitas, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 927 days.

(21) Appl. No.: 17/924,543

(22) PCT Filed: May 13, 2021

(86) PCT No.: PCT/EP2021/062774
§ 371 (c)(1),
(2) Date: Nov. 10, 2022

(87) PCT Pub. No.: WO2021/244830
PCT Pub. Date: Dec. 9, 2021

(65) Prior Publication Data

US 2023/0185187 A1 Jun. 15, 2023

Related U.S. Application Data

(60) Provisional application No. 63/033,363, filed on Jun. 2, 2020.

(51) Int. Cl.
*G06F 30/398* (2020.01)
*G03F 1/70* (2012.01)

(52) U.S. Cl.
CPC .............. *G06F 30/398* (2020.01); *G03F 1/70* (2013.01)

(58) Field of Classification Search
None
See application file for complete search history.

(56) References Cited

U.S. PATENT DOCUMENTS

| | | | |
|---|---|---|---|
| 5,229,872 | A | 7/1993 | Mumola |
| 6,046,792 | A | 4/2000 | Van Der Werf et al. |

(Continued)

FOREIGN PATENT DOCUMENTS

| | | |
|---|---|---|
| CN | 108490735 | 9/2018 |
| TW | 201945829 | 12/2019 |

(Continued)

OTHER PUBLICATIONS

Office Action issued in corresponding Korean Patent Application No. 10-2022-7042467, dated Sep. 19, 2024.

(Continued)

*Primary Examiner* — Leigh M Garbowski
(74) *Attorney, Agent, or Firm* — Pillsbury Winthrop Shaw Pittman LLP

(57) ABSTRACT

A method for verifying a feature of a mask design. The method includes determining localized shapes of the feature, and determining whether there is a breach by the feature of verification criteria based on the localized shapes. The verification criteria specifies correspondence between a threshold of a pattern characteristic and a localized shape. For example, the feature of the mask design may be a freeform curvilinear mask feature. The localized shapes may include local curvatures of individual locations on segments of the feature. In some embodiments, the threshold of the pattern characteristic is a spacing threshold, and the verification criteria specifies the spacing threshold as a function of the local curvatures. The method may facilitate enhanced mask rules checks (MRC), including better definition and verification of MRC criteria for freeform curvilinear masks, and/or have other advantages.

20 Claims, 14 Drawing Sheets

(56) References Cited

U.S. PATENT DOCUMENTS

| | | | | |
|---|---|---|---|---|
| 6,818,362 | B1 | 11/2004 | Lucas et al. | |
| 7,627,836 | B2 * | 12/2009 | Culp | G06F 30/39 716/132 |
| 9,588,438 | B2 | 3/2017 | Hsu et al. | |
| 2007/0031745 | A1 | 2/2007 | Ye et al. | |
| 2007/0050749 | A1 | 3/2007 | Ye et al. | |
| 2008/0005704 | A1 * | 1/2008 | Miloslavsky | G06F 30/398 716/54 |
| 2008/0109766 | A1 * | 5/2008 | Song | G06F 30/398 716/52 |
| 2008/0127027 | A1 * | 5/2008 | Gallatin | G03F 1/36 430/30 |
| 2008/0301620 | A1 | 12/2008 | Ye et al. | |
| 2008/0309897 | A1 | 12/2008 | Wong et al. | |
| 2009/0157630 | A1 | 6/2009 | Yuan | |
| 2010/0162197 | A1 | 6/2010 | Ye et al. | |
| 2010/0180251 | A1 | 7/2010 | Ye et al. | |
| 2010/0190342 | A1 * | 7/2010 | Kotani | G06F 30/398 716/55 |
| 2014/0215414 | A1 | 7/2014 | Sahouria | |
| 2016/0136899 | A1 | 5/2016 | Koranne | |

FOREIGN PATENT DOCUMENTS

| | | |
|---|---|---|
| WO | 2019/158682 | 8/2019 |
| WO | 2019/179747 | 9/2019 |

OTHER PUBLICATIONS

International Search Report and Written Opinion dated Aug. 18, 2021, issued in corresponding International Application No. PCT/EP2021/062774, pp. 1-10.
Office Action dated Mar. 8, 2022, issued in corresponding Taiwanese Patent Application No. 110118194, pp. 1-13.
Spence, Chris, "Full-chip lithography simulation and design analysis—How OPC is changing IC design", Proc. of SPIE, vol. 5751, pp. 1-14 (2005).
Bork, Ingo et al., "CLMPC—Curvilinear MPC in a mask data preparation flow", Proc. of SPIE, vol. 10451 (2017).
Search Report issued in corresponding Chinese Patent Application No. 202180039984, dated Jun. 16, 2026.

* cited by examiner

VERIFYING FREEFORM CURVILINEAR FEATURES OF A MASK DESIGN

CROSS-REFERENCE TO RELATED APPLICATIONS

This application is the U.S. national phase entry of PCT Patent Application No. PCT/EP2021/062774 which was filed on May 13, 2021, which claims priority of U.S. Provisional Patent Application No. 63/033,363 which was filed on Jun. 2, 2020, and which is incorporated herein in its entirety by reference.

TECHNICAL FIELD

The present description relates to verifying freeform curvilinear features of a mask design.

BACKGROUND

A lithographic projection apparatus can be used, for example, in the manufacture of integrated circuits (ICs). A patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate includes a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), and the reduction ratio can be different in x and y direction features the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula CD (critical dimension)$=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

SUMMARY

According to an embodiment, there is provided a method for verifying a feature of a mask design. The method comprises determining localized shapes of the feature; and determining whether there is a breach by the feature of verification criteria based on the localized shapes. The verification criteria specifies correspondence between a threshold of a pattern characteristic and a localized shape.

In an embodiment, the localized shapes comprise local curvatures of individual locations on segments of the feature.

In an embodiment, determining the local curvatures comprises performing curve fitting on the individual segments, and/or determining local angle deviations of the individual segments.

In an embodiment, the threshold of the pattern characteristic is a spacing threshold, and the verification criteria specifies the spacing threshold as a function of the local curvatures.

In an embodiment, the method further comprises binning similar local curvatures into bins, and determining different verification criteria for the different bins.

In an embodiment, the method further comprises identifying two locations on the feature or two locations on different features, and determining the threshold of the pattern characteristic between the two locations based on local curvatures of the locations.

In an embodiment, the threshold of the pattern characteristic between the two locations is a spacing threshold, and determining the spacing threshold between the two locations comprises: determining a first threshold based on a local curvature of a first location; determining a second threshold based on a local curvature of a second location; and/or determining a weighted combination of the first threshold and the second threshold.

In an embodiment, the pattern characteristic comprises a minimum line width, a critical dimension, or a minimum spacing between curved shapes.

In an embodiment, the feature of the mask design is a freeform curvilinear mask feature.

In an embodiment, the method further comprises, responsive to a breach by the feature of the verification criteria; adjusting the feature based on the breach.

In an embodiment, the breach is detected by (1) determining a dimension of the feature, a shape of the feature, a location of the feature in the mask design, and/or a position of the feature in the mask design relative to other features; and (2) comparing the dimension of the feature, the shape of the feature, the location of the feature in the mask design, and/or the position of the feature in the mask design relative to other features to a corresponding threshold of the verification criteria.

In an embodiment, adjusting comprises changing a dimension of the feature, a shape of the feature, a location of the feature in the mask design, and/or a position of the feature in the mask design relative to other features.

In an embodiment, adjusting comprises identifying two or more related individual segments of the feature, determining which segment or segments of the two or more related individual segments to adjust, and determining how much to adjust each one of the two or more related individual segments.

In an embodiment, determining which segment or segments of the two or more related individual segments to adjust, and how much to adjust a given segment, is based on an extent to which an adjustment to an individual one of the two or more related individual segments reduces or eliminates a corresponding breach.

In an embodiment, the adjusting comprises one or more penalty adjustments. The one or more penalty adjustments may comprise equal adjustments to each one of the two or more related individual segments, an adjustment to only one of the two or more related individual segments, or unequal adjustments to each one of the two or more related individual segments.

According to another embodiment, there is provided a non-transitory computer readable medium having instructions thereon is provided. The instructions, when executed by a computer, cause the computer to: determine localized shapes of a feature of a mask design; and determine whether there is a breach by the feature of verification criteria based on the localized shapes. The verification criteria specifies correspondence between a threshold of a pattern characteristic and a localized shape.

In an embodiment, the localized shapes comprise local curvatures of individual locations on segments of the feature.

In an embodiment, determining the local curvatures comprises performing curve fitting on the individual segments, and/or determining local angle deviations of the individual segments.

In an embodiment, the threshold of the pattern characteristic is a spacing threshold, and wherein the verification criteria specifies the spacing threshold as a function of the local curvatures.

The function may be defined as a continuous function, a discrete function, or a piecewise defined function.

In an embodiment, the instructions are further configured to cause the computer to bin similar local curvatures into bins, and determine different verification criteria for the different bins.

In an embodiment, the instructions are further configured to cause the computer to identify two locations on the feature or two locations on different features, and determine the threshold of the pattern characteristic between the two locations based on local curvatures of the locations.

In an embodiment, the threshold of the pattern characteristic between the two locations is a spacing threshold, and determining the spacing threshold between the two locations comprises: determining a first threshold based on a local curvature of a first location; determining a second threshold based on a local curvature of a second location; and/or determining a weighted combination of the first threshold and the second threshold.

In an embodiment, the pattern characteristic comprises a minimum line width, a critical dimension, or a minimum spacing between curved shapes.

In an embodiment, the feature of the mask design is a freeform curvilinear mask feature.

In an embodiment, the instructions are further configured to cause the computer to, responsive to a breach of the verification criteria by the feature; adjust the feature based on the breach.

In an embodiment, the breach is detected by (1) determining a dimension of the feature, a shape of the feature, a location of the feature in the mask design, and/or a position of the feature in the mask design relative to other features; and (2) comparing the dimension of the feature, the shape of the feature, the location of the feature in the mask design, and/or the position of the feature in the mask design relative to other features to a corresponding threshold of the verification criteria.

In an embodiment, the adjusting comprises changing a dimension of the feature, a shape of the feature, a location of the feature in the mask design, and/or a position of the feature in the mask design relative to other features.

In an embodiment, the adjusting comprises identifying two or more related individual segments of the feature, determining which segment or segments of the two or more related individual segments to adjust, and determining how much to adjust each one of the two or more related individual segments.

In an embodiment, determining which segment or segments of the two or more related individual segments to adjust, and how much to adjust a given segment, is based on an extent to which an adjustment to an individual one of the two or more related individual segments reduces or eliminates a corresponding breach.

In an embodiment, the adjusting comprises one or more penalty adjustments. The one or more penalty adjustments comprise equal adjustments to each one of the two or more related individual segments, an adjustment to only one of the two or more related individual segments, or unequal adjustments to each one of the two or more related individual segments.

According to another embodiment, a method for adjusting a feature of a mask design is provided. The method comprises determining localized shapes of the feature; determining whether there is a breach by the feature of verification criteria based on the localized shapes, where the verification criteria specifies correspondence between a threshold of a pattern characteristic and a localized shape; and adjusting the feature based on the detected breach.

In an embodiment, the adjusting comprises changing a dimension of the feature, a shape of the feature, a location of the feature in the mask design, and/or a position of the feature in the mask design relative to other features.

In an embodiment, the localized shapes comprise local curvatures of individual locations on segments of the feature.

In an embodiment, determining the local curvatures comprises performing curve fitting on the segments, and/or determining local angle deviations of the segments.

In an embodiment, the threshold of the pattern characteristic is a spacing threshold, and the verification criteria specifies the spacing threshold as a function of the local curvatures.

DETAILED DESCRIPTION

Figure 1:
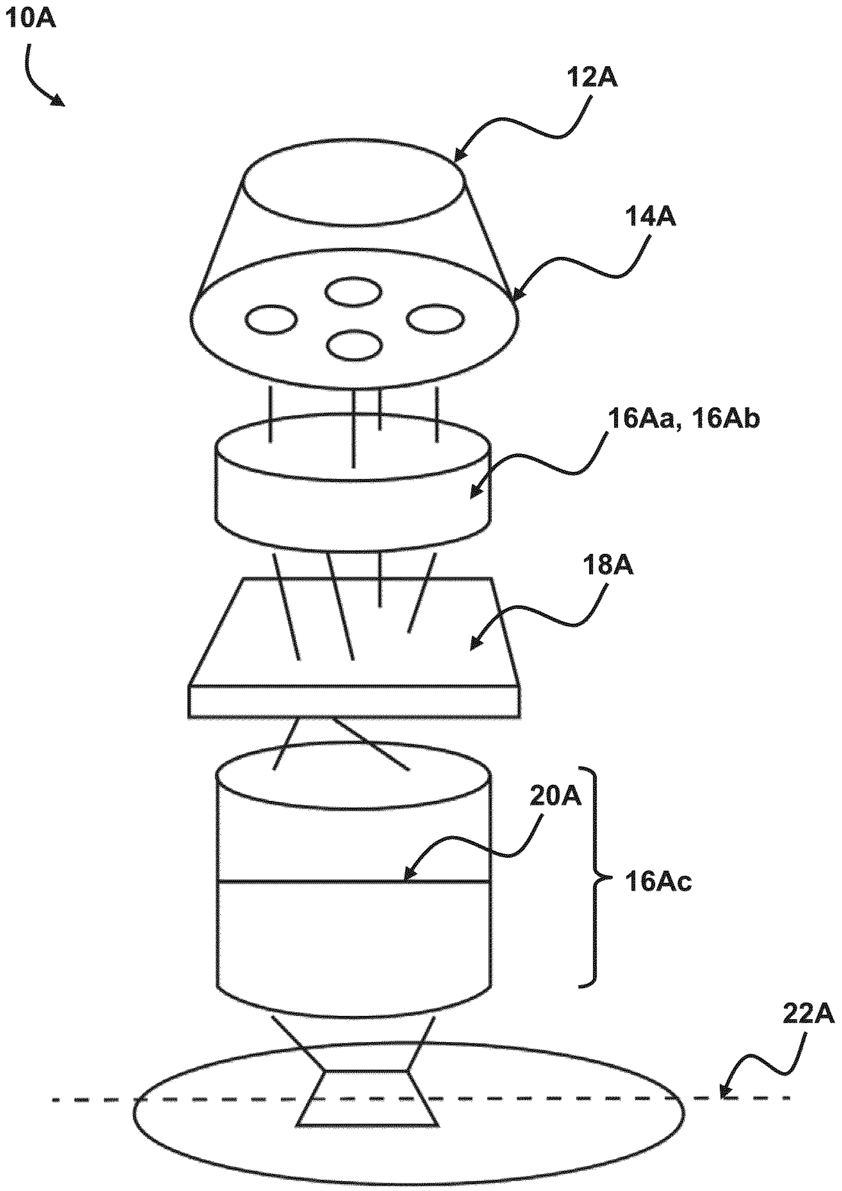
FIG. 1 shows a block diagram of various subsystems of a lithography system.

A patterning device such as a lithography mask can comprise, or can form, one or more design layouts. The design layout can be generated utilizing CAD (computer-aided design) programs and/or other tools. This process is often referred to as EDA (electronic design automation). Most CAD programs follow a set of predetermined rules in order to create functional design layouts and/or patterning devices such as masks. These rules are set based on processing and design limitations. For example, design rules define the space tolerance between devices (such as gates, capacitors, etc.), interconnect lines, and/or other features, to ensure that the devices, lines, and/or other features do not interact with one another in an undesirable way. The rules attempt to ensure the original design intent is faithfully reproduced on a substrate (via the patterning device). Similar rules govern patterning device (e.g., mask) design.

A mask rules check (MRC) may be performed specifically for a mask. The MRC may be performed to verify that features of a mask design do not interact with one another in an undesirable way, the mask is properly configured to ensure a design intent is reproduced on a substrate, and/or for other reasons. MRC technology is well defined for typical Manhattan masks. Typical masks have features with linear (e.g., not curved) edges, often positioned at right angles to each other. However, for freeform curvilinear masks, MRC rule definition and feature verification is challenging. Until now, there has been no reliable MRC technique having a rigorous and efficient approach for handling curvilinear freeform masks. For example, image-based MRC techniques struggle with ensuring MRC-clean masks, and also have much less flexibility when defining the various MRC rules compared to the flexibility desired by a mask house. An MRC-clean mask is a mask with no MRC violations.

Advantageously, the present disclosure describes a powerful and flexible technique for verifying mask features during MRC of arbitrary geometries, including curvilinear freeform features and Manhattan features. Using the present technique, separate localized shapes, such as curvatures, for different mask feature contour segments are determined. This facilitates definition of verification criteria that specifies a correspondence between thresholds of various pattern characteristics and the localized shapes. As a result, MRC verification criteria for freeform curvilinear masks may be defined using equations, through binning (e.g., bin similar local curvatures into bins, and determine different verification criteria for the different bins), and/or other operations.

This approach gives great flexibility as to how to provide MRC verification criteria for freeform curvilinear masks (e.g., from the fab) to a mask house in a familiar and/or understandable way. For example, local curvatures are physically understood and this proposed approach converges to a Manhattan mask 1D-2D MRC definition at its limits. This technique also facilitates resolution of MRC verification criteria violations (breaches) per-localized feature edge shape, and passing corresponding feature shape adjustments as a penalty cost to a (e.g., free form) optimizer.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms “reticle”, “wafer” or “die” in this text should be considered as interchangeable with the more general terms “mask”, “substrate” and “target portion”, respectively.

The term “mask”, “reticle”, or “patterning device” as employed in this text may be broadly interpreted as referring to a generic patterning device that can be used to endow an incoming radiation beam with a patterned cross-section, corresponding to a pattern that is to be created in a target portion of the substrate. The term “light valve” can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example is given in U.S. Pat. No. 5,229,872, which is incorporated herein by reference.

In the present document, the terms “radiation” and “beam” are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term “projection optics” as used herein should be broadly interpreted as encompassing various types of optical systems, including refractive optics, reflective optics, apertures and catadioptric optics, for example. The term “projection optics” may also include components operating according to any of these design types for directing, shaping or controlling the projection beam of radiation, collectively or singularly. The term “projection optics” may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As a brief introduction, FIG. 1 illustrates an exemplary lithographic projection apparatus 10A. Major components are a radiation source 12A, which may be a deep-ultraviolet (DUV) excimer laser source or other type of source including an extreme ultra violet (EUV) source (as discussed above, the lithographic projection apparatus itself need not have the radiation source), illumination optics which, for example, define the partial coherence (denoted as sigma) and which may include optics components 14A, 16Aa and 16Ab that shape radiation from radiation source 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin $(\Theta_{max})$, wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device (e.g., mask), onto a substrate. The projection optics may include at least some of the optics components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device (e.g., mask) used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply optical proximity correction (OPC) using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

One aspect of understanding a lithographic process is understanding the interaction of the radiation and the patterning device (e.g., mask). The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
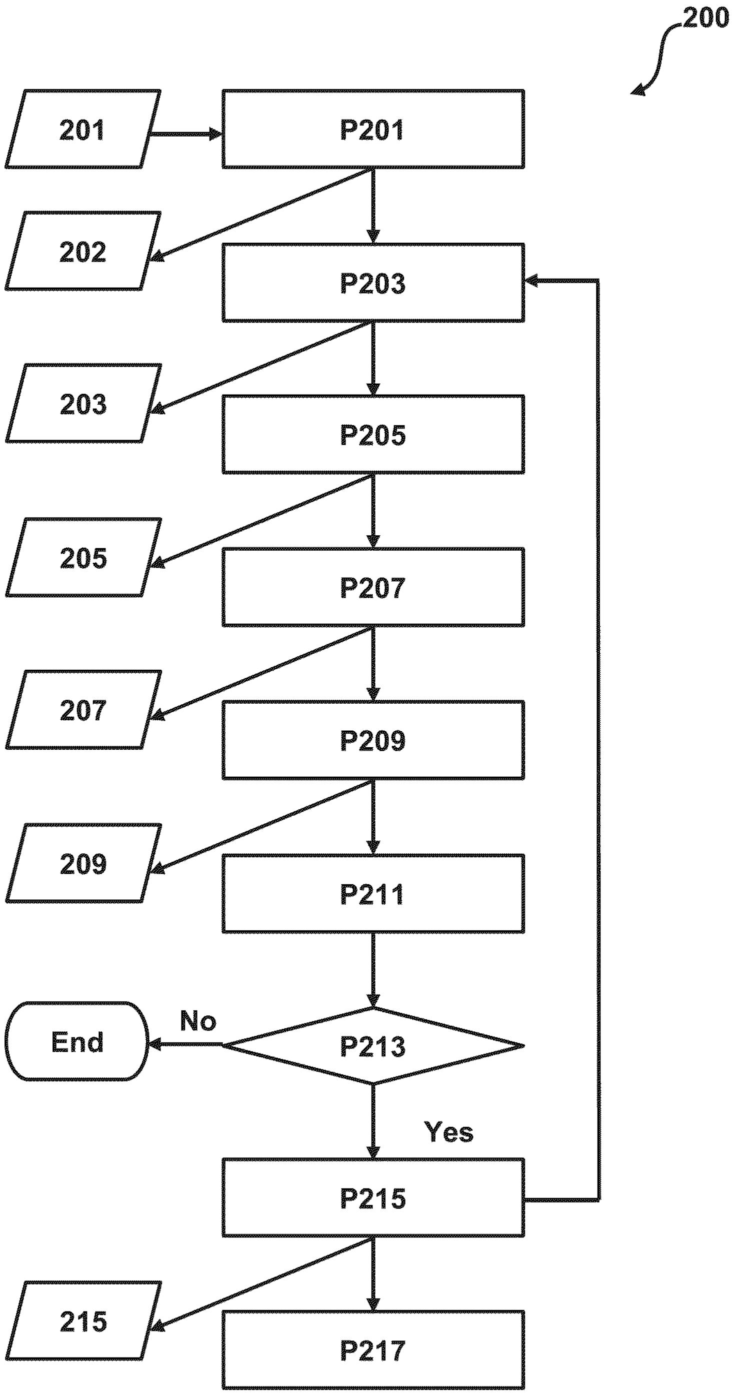
FIG. 2 is flow chart of a method for determining a patterning device pattern or a target pattern to be printed on a substrate, according to an embodiment.

FIG. 2 is flow chart of a method 200 for determining a patterning device pattern (or mask pattern, hereinafter) from an image (e.g., continuous transmission mask image, a binary mask image, a curvilinear mask image, etc.) corresponding to a target pattern to be printed on a substrate via a patterning process involving a lithographic process. In an embodiment, the design layout or the target pattern may be a binary design layout, a continuous tone design layout, or a design layout of another suitable form.

The method 200 is an iterative process, where an initial image (e.g., enhanced image, mask variables initialized from a CTM image, etc.) is progressively modified to generate different types of images according to different processes of the present disclosure to eventually generate information comprising mask patterns or an image (e.g., a mask variables corresponding to a final curvilinear mask) further used to fabricate/manufacture a mask. The iterative modification of the initial image may be based on a cost function, where during an iteration the initial image may be modified such that the cost function is reduced, in an embodiment, minimized. In an embodiment, the method 200 may also be referred to as a BINARIZED CTM process, where an initial image is an optimized CTM image which is further processed according to the present disclosure to generate a curvilinear mask patterns (e.g., geometry or polygonal representation shapes of a curvilinear mask or curvilinear pattern). In an embodiment, the initial image may be the enhanced image of the CTM image). The curvilinear mask patterns may be in the form of a vector, a table, mathematical equations, or other forms of representing geometric/polygonal shapes.

In an embodiment, process P201 may involve obtaining an initial image (e.g., a CTM image or an optimized CTM image, or a binary mask image). In an embodiment, initial image 201 may be a CTM image generated by a CTM generation process based on a target pattern to be printed on a substrate. The CTM image may then be received by the process P201. In an embodiment, the process P201 may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model (e.g., Tachyon model) is applied to obtain optical or resist images and cost functions are computed. The cost computation then gives the gradient values that are used in the optimization solver to update variables (e.g., pixel intensities). After several iterations during optimization, a final mask image is generated, which is further used as guidance map for pattern extraction (e.g., as implemented in Tachyon SMO software). Such an initial image (e.g., the CTM image) may include one or more features (e.g., a feature of a target pattern, SRAFs, SRIFs, etc.) corresponding to the target pattern to be printed on the substrate via the patterning process.

In an embodiment, the CTM image (or an enhanced version of the CTM image) may be used to initialize the mask variables that can be used as the initial image 201, which is iteratively modified as discussed below.

The process P201 may involve generating an enhanced image 202 based on the initial image 201. An enhanced image 202 may be an image where certain selected pixels within the initial image 201 are amplified. The selected pixels may be pixels having relatively lower values (or weak signals) within the initial image 201. In an embodiment, the selected pixels be pixels have signal values lower than, for example, an average intensity of pixels throughout the initial image, or a given threshold value. In other words, pixels with weaker signals within the initial image 201 are amplified, thus enhancing one or more features within the initial image 201. For example, a second order SRAFs around a target feature may have a weak signal that may be amplified. Thus, the enhanced image 202 may highlight or identify additional features (or structures) that may be included within a mask image (generated later on in the method). In a conventional method (e.g., CTM method) of determining a mask image, weak signals within an initial image may be ignored and as such, the mask image may not include features that may be formed from a weak signal in an initial image 201.

The generation of the enhanced image 202 involves applying an image processing operation such as a filter (e.g., an edge detection filter) to amplify weak signals within the initial image 201. Alternatively or in addition, the image processing operation may be deblurring, averaging, and/or feature extraction or other similar operations. Examples of the edge detection filter include the Prewitt operator, Laplacian operator, Laplacian of Gaussian (LoG) filter, etc. The generation step may further involve combining the amplified signals of the initial image 201 with original signals of the initial image 201 with or without modifying the original strong signals of the initial image 201. For example, in an embodiment, for one or more pixel values at one or more locations (e.g., at contact holes) across the initial image 201, the original signal may be relatively strong (e.g., above a certain threshold such as 150 or below −50), then the original signal at the one or more locations (e.g., at contact holes) may not be modified or combined with the amplified signal for that location.

In an embodiment, noise (e.g., random variation in brightness or color or pixel values) in the initial image 201 may also be amplified. So, alternatively or in addition, a smoothing process may be applied to reduce noise (e.g., random variation in brightness or color or pixel values) in the combined image. Examples of image smoothing methods include Gaussian blur, running average, low-pass filters, etc.

In an embodiment, the enhanced image 202 may be generated using an edge detection filter. For example, an edge detection filter may be applied to the initial image 201 to generate a filtered image that highlights edges of one or more features within an initial image 201. The resulting filtered image may be further combined with the original image (i.e., the initial image 201) to generate the enhanced image 202. In an embodiment, the combining of the initial image 201 and the image obtained after edge filtering may involve modifying only those parts of the initial image 201 that have weak signals without modifying the regions having strong signals, and the combining process could be weighted based on signal strength. In an embodiment, amplifying of the weak signal may also amplify noise within the filtered image Hence, according to an embodiment, a smoothing process may be performed on the combined image. A smoothing of an image may refer to an approximating function that attempts to capture important patterns (e.g., target pattern, SRAFs) in the image, while leaving out noise or other fine-scale structures/rapid phenomena. In smoothing, the data points of a signal may be modified so individual points (presumably because of noise) may be reduced, and points that may be lower than the adjacent points may be increased leading to a smoother signal or a smoother image. Thus, upon smoothing operation, the further smooth version of the enhanced image 202 having reduced noise may be obtained, according to an embodiment of the present disclosure.

The method, in process P203, may involve generating mask variables 203 based on the enhanced image 202. In a first iteration, the enhanced image 202 may be used to initialize the mask variables 203. In later iterations the mask variables 203 may be updated iteratively.

A contour extraction of a real-valued function $f$ of n real variables, is a set of the form:

$$L_c(f)=\{(x_1,x_2, \ldots x_n)|f(x_1,x_2, \ldots x_n)=c\}$$

In a two dimensional space, the set defines the points on the surface at which the function $f$ equals to given value c. In a two dimensional space, the function $f$ is able to extract a closed contour which will be rendered to the mask image.

In the above equation, $x_1, x_2, \ldots x_n$ refer to mask variables such as the intensity of an individual pixel, which determines the locations where the curvilinear mask edge exists with a given constant value c (e.g. a threshold plane as discussed in process P205 below).

In an embodiment, at an iteration, the generating of the mask variables 203 may involve modifying one or more values of variables (e.g., pixel values at one or more locations) within the enhanced image 202 based on, for example, initialization conditions or a gradient map (which may be generated later on in the method). For example, the one or more pixel values may be increased or decreased. In other words, the amplitude of one or more signals within the enhanced image 202 may be increased or decreased. A modified amplitude of the signals may enable generation of different curvilinear patterns depending on an amount of change in the amplitude of the signal. Thus, the curvilinear patterns gradually evolve until a cost function is reduced, in an embodiment, minimized. In an embodiment, further smoothing may be performed on the level mask variables 203.

Furthermore, process P205 involves generating curvilinear mask patterns 205 (e.g., having polygon shapes represented in a vector form) based on the mask variables 203. The generation of the curvilinear mask patterns 205 may involve thresholding of the mask variables 203 to trace or generate curvilinear (or curved) patterns from the mask variables 203. For example, thresholding may be performed using a threshold plane (e.g., an x-y plane) having a fixed value which intersects the signals of the mask variables 203. The intersection of the threshold plane with the signals of the mask variables 203 generates tracings or outlines (i.e., curved polygon shapes) which form polygonal shapes that serve as the curvilinear patterns for the curvilinear mask patterns 205. For example, the mask variables 203 may be intersected with the zero plane parallel to the (x,y) plane. Thus, the curvilinear mask patterns 205 may be any curvilinear patterns generated as above. In an embodiment, the curvilinear patterns traced or generated from the mask variables 203 depend on the signals of the enhanced image 202. As such, the image enhancement process P203 facilitates improvement in patterns generated for a final curvilinear mask patterns. The final curvilinear mask patterns may be further used by a mask manufacturer to fabricate a mask for use in a lithography process.

Process P207 may involve rendering the curvilinear mask patterns 205 to generate a mask image 207. Rendering is an operation performed on the curvilinear mask patterns, which is a similar process as converting rectangle mask polygons into discrete grayscale image representations. Such a process could be generally understood as sampling the box function of continuous coordinates (polygons) into values at each point of image pixels.

The method further involves a forward simulation of the patterning process using process models that generate or predict a pattern that may be printed on a substrate based on the mask image 207. For example, process P209 may involve executing and/or simulating the process model using the mask image 207 as input and generating a process image 209 on the substrate (e.g., an aerial image, a resist image, etch image, etc.). In an embodiment, the process model may include a mask transmission model coupled to an optics model which is further coupled to a resist model and/or etch model. The output of the process model may be a process image 209 that has factored in different process variations during the simulation process. The process image may be further used to determine parameters (e.g., edge placement error, critical dimension, overlay, sidelobe, etc.) of the patterning process by, for example, tracing the contours of the patterns within the process image. The parameters may be further used to define a cost function, which is further used to optimize the mask image 207 such that the cost function is reduced, or in an embodiment minimized.

In process P211, a cost function may be evaluated based on the process image 209 (also referred as a simulated substrate image or substrate image or wafer image). Thus, the cost function may be considered as process aware, where variations of the patterning process, enabling generation of curvilinear mask patterns that account for variations in patterning process. For example, the cost function may be an edge placement error (EPE), sidelobe, a mean squared error (MSE), Pattern placement error(PPE), normalized image log or other appropriate variable defined based on the contour of the patterns in the process image. An EPE may be an edge placement error associated with one or more patterns and/or a summation of all the edge placement errors related to all the patterns of the process model image 209 and the corresponding target patterns. In an embodiment, the cost function may include more than one condition that may be simultaneously reduced or minimized. For example, in addition to the MRC violation (breach) probability, the number of defects, EPE, overlay, CD or other parameter may be included and all the conditions may be simultaneously reduced (or minimized).

Furthermore, one or more gradient maps may be generated based on the cost function (e.g., EPE) and mask variables may be modified based on such gradient map(s). Mask variables (MV) refer to intensities of Ø. Accordingly, the gradient computation may be represented as dEPE/dØ, and the gradient values are updated by capturing the inverse mathematical relationship from the mask image (MI) to curvilinear mask polygons to mask variables. Thus, a chain of derivatives may be computed of the cost function with respect to the mask image, from the mask image to curvilinear mask polygon, and from curvilinear mask polygon to mask variables, which allows modification of the values of the mask variables at the mask variables.

In an embodiment, image regularization may be added to reduce the complexity of the mask patterns that may be generated. Such image regularization may be mask rule checks (MRC). MRC refers to the limiting conditions of a mask manufacturing process or apparatus. Thus, the cost function may include different components, for example, based on EPE and MRC violation penalty. A penalty may be a term of the cost function that depends on a violation amount, e.g., a difference between a mask measurement and a given MRC or mask parameter (for example, a mask pattern width and an allowed (e.g., minimum or maximum) mask pattern width). Thus, according to an embodiment of the present disclosure, mask patterns may be designed and a corresponding mask may be fabricated not only based on forward simulation of the patterning process, but also additionally based on manufacturing limitations of the mask manufacturing apparatus/process. Thus, a manufacturable curvilinear mask producing high yield (i.e., minimum defects) and high accuracy in terms of, for example, EPE or overlay on the printed pattern may be obtained.

The pattern corresponding to a process image should be exactly the same as the target pattern, however, such exact target patterns may not feasible (for example, typically sharp corners) and some conflictions are introduced due to the variations in the patterning process itself and/or approximations in the models of the patterning process. In a first iteration of the method, the mask image 207 may not generate a pattern (in the resist image) which is similar to the target pattern. The determination of accuracy or acceptance of the printed pattern in the resist image (or etch image) may be based on the cost function such as EPE. For example, if the EPE of the resist pattern is high, it indicates that the printed pattern using the mask image 207 is not acceptable and patterns in the mask variable 203 must be modified.

To determine whether a mask image 207 is acceptable, process P213 may involve determining whether the cost function is reduced or minimized, or whether a given iteration number is reached. For example, an EPE value of a previous iteration may be compared with an EPE value of the current iteration to determine whether the EPE has reduced, minimized, or converged (i.e., no substantial improvement in printed pattern is observed). When the cost function is minimized, the method may stop and the curvilinear mask patterns information that is generated is considered as an optimized result.

However, if the cost function is not reduced or minimized, and the mask related variables or enhanced image related variable (e.g., pixel values) may be updated. In an embodiment, the updating may be based on gradient-based method. For example, if the cost function is not reduced, the method 200 proceeds to a next iteration of generating the mask image after performing processes P215 and P217 that indicate how to further modify the mask variables 203.

The process P215 may involve generating a gradient map 215 based on the cost function. The gradient map may be a derivative and/or a partial derivative of the cost function. In an embodiment the partial derivative of the cost function may be determined with respect pixels of the mask image and derivative may be further chained to determine partial derivative with respect to the mask variables 203. Such gradient computation may involve determining inverse relationships between the mask image 207 to the mask variables 203. Furthermore, an inverse relationship of any smoothing operation (or function) performed in process P205 and P203 must be considered.

The gradient map 215 may provide a recommendation about increasing or decreasing the values of the mask variables in a manner such that value of the cost function is reduced, in an embodiment, minimized. In an embodiment, an optimization algorithm may be applied to the gradient map 215 to determine the mask variable values. In an embodiment, an optimization solver may be used to perform gradient-based computation (in process P217).

In an embodiment, for an iteration, mask variables may be changed while the threshold plane may remain fixed or unchanged in order to gradually reduce or minimize the cost function. Thus, the curvilinear patterns generated may gradually evolve during an iteration such that the cost function is reduced, or in an embodiment, minimized. In another embodiment, mask variables as well as the threshold plane may both change to achieve faster convergence of the optimization process. Upon several iterations and/or minimization of the cost function may result in final set of BINARIZED CTM results (i.e., a modified version of the enhanced image, mask image, or curvilinear mask).

In an embodiment of the present disclosure, the transition from CTM optimization with grayscale image to BINARIZED CTM optimization with curvilinear mask may be simplified by replacing the thresholding process (i.e. P203 and P205) by a different process where a sigmoid transformation is applied to the enhanced image 202 and corresponding change in gradient computation is performed. The sigmoid transformation of the enhanced image 202 generates a transformed image that gradually evolve into a curvilinear pattern during an optimization process (e.g., minimizing cost function). During an iteration or a step of optimization, variables (e.g., steepness and/or a threshold) related to sigmoid function may be modified based on the gradient computation. As the sigmoid transformation becomes sharper (e.g., increase in steepness of the slope of the sigmoid transformation) in successive iterations, a gradual transition from the CTM image to a final BINARIZED CTM image may be achieved allowing improved results in the final BINARIZED CTM optimization with curvilinear mask patterns.

In an embodiment of the present disclosure, additional steps/process may be inserted into the loop of an iteration of the optimization, to enforce the result to have selected or desired properties. For example, smoothness may be ensured by adding a smoothing step, or other filter may be used to enforce image to favor horizontal/vertical structures.

As lithography nodes keep shrinking, more and more complicated masks are required. The present method may be used in key layers with DUV scanners, EUV scanners, and/or other scanners. The method according to the present disclosure may be included in different aspect of the mask optimization process including source mask optimization (SMO), mask optimization, and/or OPC.

For example, a prior art source mask optimization process is described in U.S. Pat. No. 9,588,438 titled "Optimization Flows of Source, Mask and Projection Optics", which is incorporated in its entirety by reference. This prior art source mask optimization process is performed for the center of a slit on a typical layout clip. The resulting optimization of the source and mask variables are considered representative of all positions on the slit (and/or other positions).

Optical proximity correction (OPC) enhances an integrated circuit patterning process by compensating for distortions that occur during processing. The distortions occur during processing because features printed on a wafer are smaller than the wavelengths of light used in the patterning and printing process. OPC verification identifies OPC errors or weak points in a post-OPC wafer design that could potentially lead to patterning defects on the wafer. ASML Tachyon Lithography Manufacturability Check (LMC) is an OPC verification product, for example.

OPC addresses the fact that the final size and placement of an image of the design layout projected on the substrate will not be identical to, or simply depend only on the size and placement of the design layout on the patterning device. In the context of resolution enhancement techniques (RET) such as OPC, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to increase the chance that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design, almost every feature of the design layout has some modification in order to achieve high fidelity of the projected image to the target design. These modifications may include shifting or biasing of edge positions or line widths as well as application of "assist" features that are intended to assist projection of other features.

One form of OPC is selective bias. Given a CD vs. pitch curve, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD versus pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other OPC techniques have been developed for application beyond the one-dimensional bias example above. A two-dimensional proximity effect is line end shortening. Line ends tend to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of integrated circuit design and manufacturing is to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the design layout. The terms "main feature" and "assist feature" do not imply that a particular feature on a patterning device must be labeled as one or the other.

A mask rules check (MRC) may be performed as part of one or more of the operations shown in FIG. 2. As described above, designers follow a set of predetermined design rules in order to create functional patterning devices such as masks. These rules are set based on processing and design limitations. For example, design rules define the space tolerance and/or other tolerances between features on a mask to ensure that, once manufactured, the mask features do not interact with one another in an undesirable way. The present technique provides for verifying curvilinear freeform mask features. This may be performed during MRC, for example. Using the present technique, separate localized shapes, such as curvatures, for different mask feature contour segments are determined. This facilitates definition of verification criteria that specifies a correspondence between thresholds of various pattern characteristics and the localized shapes. As a result, MRC verification criteria for freeform curvilinear masks may be defined using equations, through binning (e.g., bin similar local curvatures into bins, and determine different verification criteria for the different bins), and/or other operations. This approach gives great flexibility as to how to provide MRC verification criteria for freeform curvilinear masks (e.g., from the fab) to a mask house in a familiar and/or understandable way.

Figure 3:
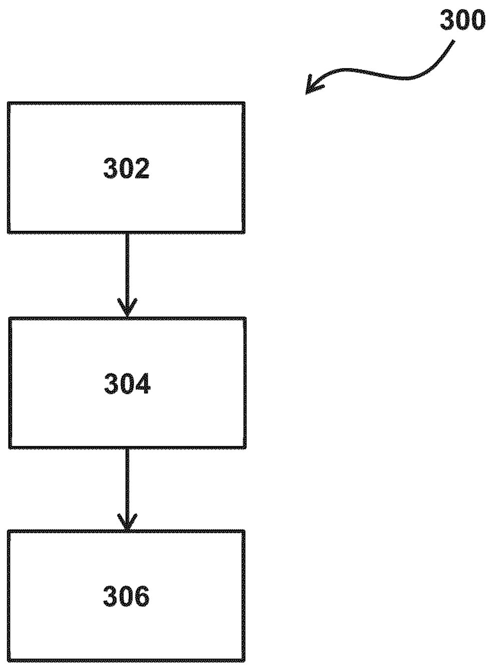
FIG. 3 illustrates an example of a present method for verifying curvilinear features of a mask design, according to an embodiment.

FIG. 3 illustrates an example of an exemplary method 300 for verifying features of a mask design according to an embodiment of the present disclosure. In some embodiments, the features may be freeform curvilinear mask features. Method 300 may be associated with a mask rules check (MRC), for example. Method 300 shown in FIG. 3 includes determining 302 localized shapes of one or more mask features, determining 304 whether there is a breach, by one or more of the mask features, of verification criteria based on the localized shapes, adjusting 306 one or more of the features responsive to a breach, and/or other operations.

The operations of method 300 are intended to be illustrative. In some embodiments, method 300 may be accomplished with one or more additional operations not described, and/or without one or more of the operations discussed. For example, in some embodiments, method 300 need not include adjusting operation 306. Additionally, the order in which the operations of method 300 are illustrated in FIG. 3 and described below is not intended to be limiting. In some embodiments, one or more portions of method 300 may be implemented (e.g., by simulation, modeling, etc.) in one or more processing devices. The one or more processing devices may include one or more devices executing some or all of the operations of method 300 in response to instructions stored electronically on an electronic storage medium. The one or more processing devices may include one or more devices configured through hardware, firmware, and/or software to be specifically designed for execution of one or more of the operations of method 300, for example.

Method 300 includes determining 302 localized shapes of one or more mask features. The localized shapes may include shapes of sub-portions of a feature. The sub-portions may include individual point locations on a feature, individual segments of a feature, areas of a feature that comprise something less than the whole feature, and/or other sub-portions. The shapes may include angles, lengths, curvatures, and/or other shapes associated with the point locations, segments, areas, and/or other sub-portions. In some embodiments, the localized shapes may be determined relative to each other, relative to a reference shape, relative to one or more locations and/or other features of the mask design, and/or in other ways. In some embodiments, the localized shapes comprise local curvatures of individual locations on segments of the feature, and/or other localized shapes.

Figure 4:
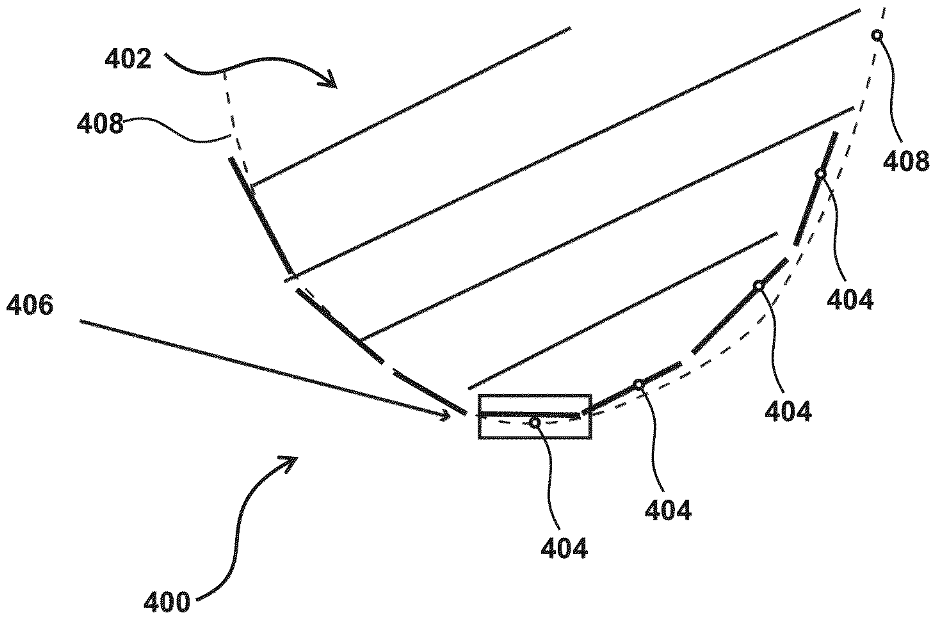
FIG. 4 illustrates determining local curvatures of individual mask feature segments using curve fitting, according to an embodiment.

In some embodiments, determining the local curvatures comprises performing curve fitting on the individual segments, determining local angle deviations of the individual segments, and/or other determinations. By way of a non-limiting example, FIG. 4 illustrates determining local curvatures 400 of individual mask feature 402 segments 404 using curve fitting according to an embodiment of the present disclosure. Feature 402 is divided into a number of segments 404. Segments 404 may be oriented at any angle such that together they form a curvilinear edge of feature 402. In some embodiments, operation 302 (FIG. 3) comprises determining local curvatures of individual segments 404. As shown in this example, the local curvatures may be determined by curve fitting. FIG. 4 illustrates a segment of interest 406, and a fitted curve 408. The curve fitting may comprise quadratic, cubic, and/or higher order curve fitting using N adjacent segments 404 (and/or a number of segments 404 within a user defined adjacency length). The curve fitting may be performed, for example, according to the equation:

$$k=-y''/(1+y'^2)^{3/2} \quad [1]$$

where k is the curvature of the contour, y' is the first order derivative of the contour's y location with respect to its x location, and y" is the second order derivative of the contour's y location with respect to its x location.

Figure 5:
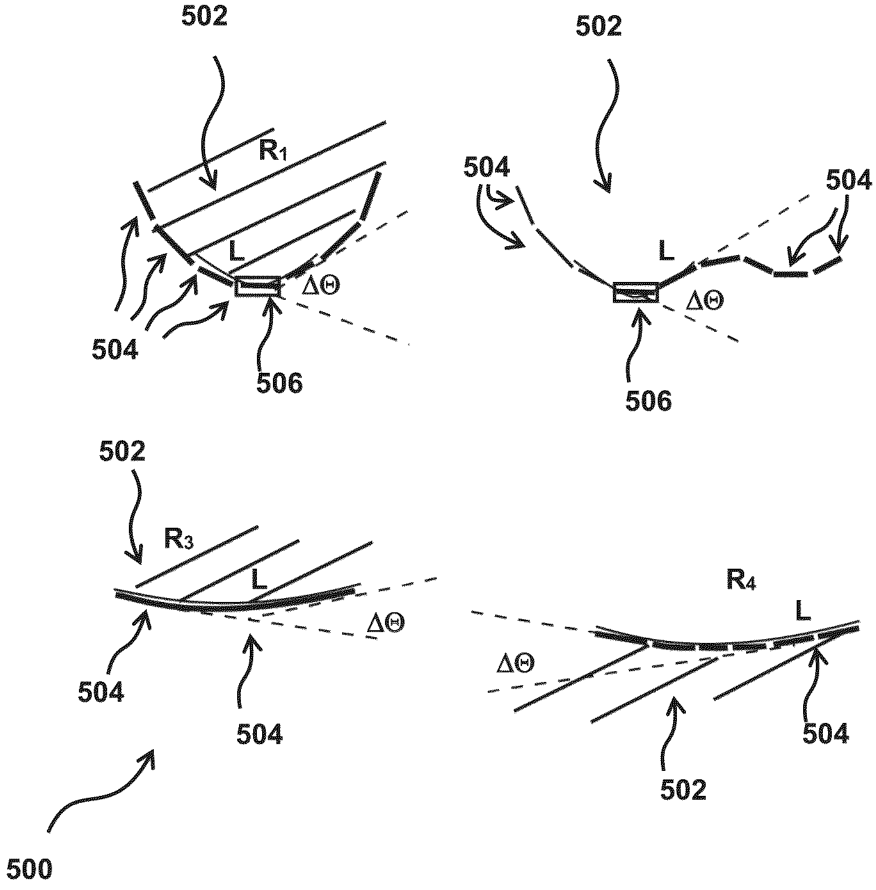
FIG. 5 illustrates determining local curvatures of individual mask feature segments based on local angle deviations of individual segments, according to an embodiment.

By way of another non-limiting example, FIG. 5 illustrates determining 500 local curvatures $R_1$, $R_2$, $R_3$, and $R_4$, of individual mask feature 502 segments 504 based on local angle deviations $\Delta\theta$ of segments 504. FIG. 5 illustrates an initial segment of interest 506 having a length L. The local angle deviations are normalized to local segment lengths. In FIG. 5, curvature=$\Delta\theta$/L, where L represents the local segment length. In FIG. 5, $L=L_{n-1}+L_n+L_{n+1}$, and $\Delta\theta=\theta_{n+1}-\theta_{n-1}$. In this example, $R_1=R_2<R_3=-R_4$.

Returning to FIG. 3, method 300 includes determining 304 whether there is a breach, by one or more of the mask features, of verification criteria based on the localized shapes. The verification criteria specifies correspondence between a threshold of a pattern characteristic and a localized shape. This correspondence may be programmed into the present systems and methods, determined based on prior data for prior similar mask features, determined manually by a user (e.g., via a user interface), and/or determined by other methods. In prior systems this flexibility is not available. In contrast, the present systems and methods may be configured such that a user may set a single value for any shape interaction. In some embodiments, this correspondence comprises rules defined as part of an MRC.

As described above, the localized shape may comprise a curvature, and/or other localized shapes. In some embodiments, the verification criteria specifies the threshold of the pattern characteristic as a function of the local curvatures. The function may be mathematical and/or may include other specification mechanisms such as binning, or a lookup table. In some embodiments, the pattern characteristic comprises a minimum line width, a critical dimension, a minimum spacing between curved shapes, and/or other pattern characteristics. By way of a non-limiting example, in some embodiments, the threshold of the pattern characteristic is a spacing threshold, and the verification criteria specifies the spacing threshold as a function of the local curvatures. The function may be defined as a continuous function, a discrete function, and/or a piecewise defined function, etc. The verification criteria may specify a threshold based on whether the local curvature is positive or negative (e.g., an orientation or direction of the curvature), based on determined values of the local curvatures (which may also indicate whether a local curvature is positive or negative), and/or other information.

Figure 6:
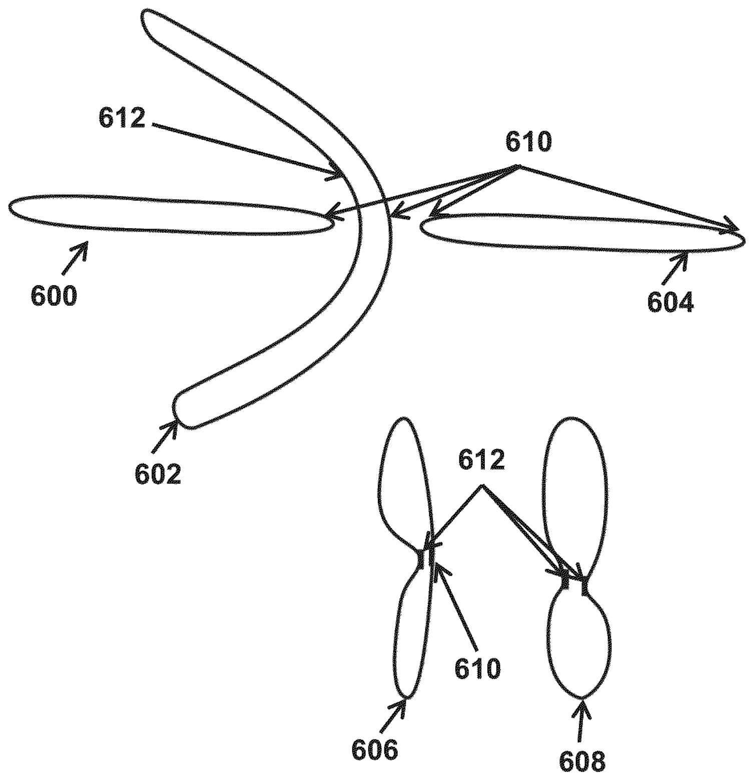
FIG. 6 show examples of positive and negative curvatures for various features of a mask design, according to an embodiment.

FIG. 6 show examples of positive and negative curvatures for various features (e.g., of a mask design) 600, 602, 604, 606, 608. Arrows point to examples of positive 610 and negative 612 local curvatures on each of the features. As described herein, MRC (pattern characteristic) threshold values (e.g., included in the verification criteria) can be defined as a function of the mask feature local curvatures. This may include differentiating between positive and negative local curvatures as shown here, and defining MRC (pattern characteristic) threshold values accordingly. For example, pattern characteristic threshold values and/or other verification criteria may correspond to and/or differentiate between positive curvatures and negative curvatures, transitions from one positive local curvature to another, a positive local curvature to a negative local curvature, one negative local curvature to another, and/or other curvatures. As another example, pattern characteristic threshold values may vary as a mathematical function of local curvature values.

Figure 7:
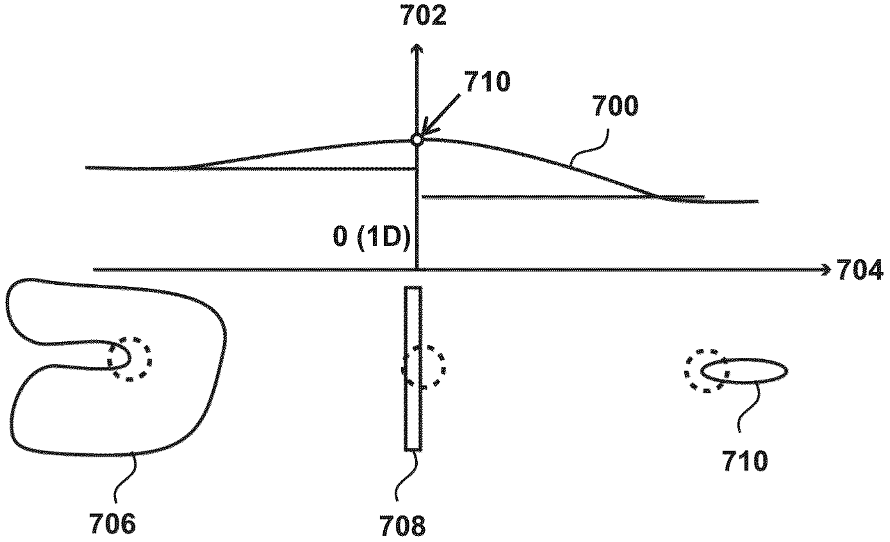
FIG. 7 shows an example of varying a verification criteria threshold based on curvature, according to an embodiment.

FIG. 7 shows an example of 700 a verification criteria pattern characteristic threshold 702 defined as a function of local curvature 704. In this example, threshold 702 is for a spacing characteristic for example mask features 706, 708, and 710. As local curvature 704 changes from negative to positive across example features 706, 708, and 710 (as indicated by the dotted circles on each feature), verification criteria threshold 702 varies 700 accordingly. In this example, threshold 702 is at its largest 710 when local curvature 704 is zero. Among other advantages, this flexibility of defining a threshold based on local curvature facilitates more accurate mapping of mask house MRC process/inspection limitations. These examples are not intended to be limiting.

Returning to FIG. 3, in some embodiments, operation 304 comprises binning similar local curvatures into bins, and determining different verification criteria for the different bins. For example, different spacing (as just one example) thresholds may be determined for different bins of local curvatures. Bins may correspond to individual local curvature values (e.g., threshold value 1 for any occurrence of curvature value X), ranges of local curvature values (e.g., threshold value 1 for any local curvature value within the range Y-Z), positive local curvatures and negative local curvatures (e.g., threshold value 1 for positive local curvatures and threshold value 2 for negative local curvatures), and/or other local curvature values. In some embodiments, the different verification criteria determined for the different bins may account for nearby features and/or curvatures relative to the curvature(s) in a bin. For example, verification criteria for the different bins may account for transitions between different positive local curvatures (e.g., threshold value 1 for first positive local curvature and threshold value 2 for adjacent positive local curvature), transitions between a positive local curvature and a negative local curvature (e.g., threshold value 1 for positive local curvature and threshold value 2 for adjacent negative local curvature), transitions between different negative local curvatures (e.g., threshold value 1 for negative local curvature and threshold value 2 for adjacent negative local curvature), etc. Binning can be done either manually by the user, or binning parameters can be optimized and recommended by the system to the user.

In some embodiments, operation 304 includes identifying two locations on segments of the feature or two locations on different segments of different features (and/or any number of locations on any number of segments and/or features), and determining the threshold of the pattern characteristic between the locations based on local curvatures of the locations. In these embodiments, using first and second locations as an example, a first threshold for the first location may be determined based on a local curvature at the first location. A second threshold for the second location may be determined based on a local curvature at the second location. However, the local curvature at the first location may be different than the local curvature at the second location such that the thresholds for each are not the same (e.g., because the first and second thresholds are determined based on the different first and second local curvatures as described herein). Operation 304 comprises determining the threshold of the pattern characteristic based on these different thresholds. When different curvatures having different thresholds are present, a decision may be necessary. In some embodiments, operation 304 comprises determining the threshold of the pattern characteristic by determining a more conservative or more aggressive of the different thresholds, weighting the different thresholds, and/or determining the threshold of the pattern characteristic in other ways. The actual approach that is used (e.g., more conservative, more aggressive, a weighted combination) may be programmed into the present systems and/or methods, determined based on prior data for prior similar mask features, determined manually by a user (e.g., via a user interface), and/or by other methods.

Figure 8:
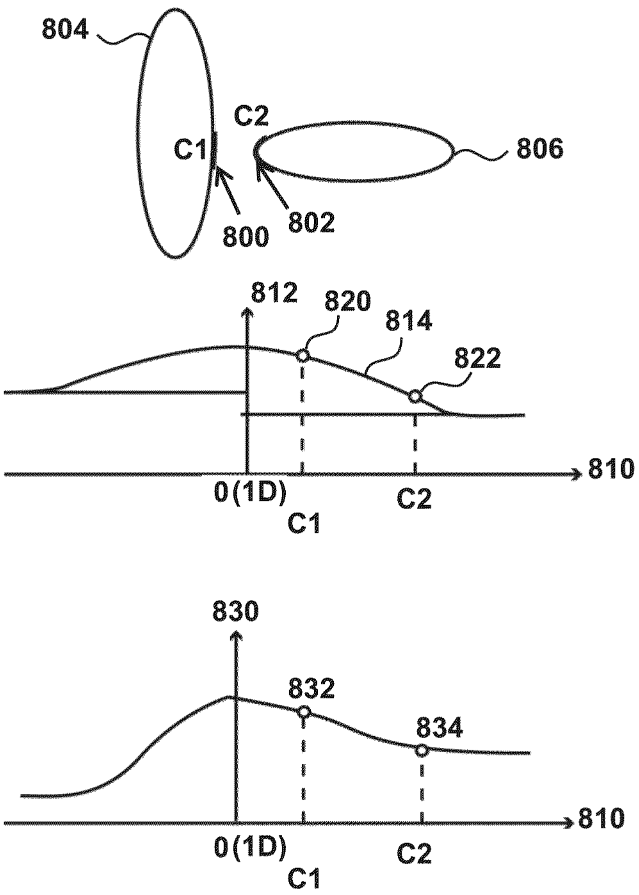
FIG. 8 illustrates identifying two locations on different features, and determining a threshold of a pattern characteristic between the two locations based on local curvatures of the locations, according to an embodiment.

FIG. 8 illustrates identifying two locations 800, 802 for segments on different features 804, 806, and determining the threshold of the pattern characteristic between the two locations based on local curvatures C1 and C2 of the segments at locations 800, 802. In this example, the threshold of the pattern characteristic between the two locations may be a spacing threshold. As shown in FIG. 8, curvatures C1 and C2 are plotted on a curvature 810 versus spacing threshold 812 plot. Threshold 812 varies 814 with curvature 810 as shown. In some embodiments, determining the spacing threshold 812 between locations 800 and 802 comprises determining a first threshold 820 based on local curvature C1 of location 800; determining a second threshold 822 based on local curvature C2 of location 802; and determining the threshold of the pattern characteristic based on thresholds 820 and 822. This may include, in some embodiments, determining threshold 820 corresponding to location 800 and curvature C1 to be the threshold of the pattern characteristic for location 800 and 802. This may represent a relatively aggressive approach because the threshold 820 for curvature C1 is larger than threshold 822 for curvature C2. Or instead, this may include, in some embodiments, determining threshold 822 corresponding to location 802 and curvature C2 to be the threshold of the pattern characteristic for location 800 and 802. This may represent a relatively conservative approach because the threshold 822 for curvature C2 is smaller than threshold 820 for curvature C1.

In some embodiments, operation 304 (FIG. 3) may include determining a weighted combination of first threshold 820 and second threshold 822. In some embodiments, the weights provided for the different thresholds 820, 822 in the weighted combination may be determined based on the curvatures and/or other information. For example, as shown in FIG. 8, C1 and C2 are also plotted on a curvature 810 versus threshold weight 830 plot. Here, threshold 820 for curvature C1 has a higher weight 832 compared to the weight 834 of threshold 822 for C2. In some embodiments, the thresholds 820 and 822 may be weighted according to the following equation:

$$[(W(C1)\times \mathrm{THRESH}(C1))+(W(C2)\times \mathrm{THRESH}(C2))]/[W(C1)+W(C2)] \quad [2]$$

where W(C1) and W(C2) represent the weights associated with C1 or C2 respectively, and THRESH (C1) and THRESH (C2) represent the thresholds associated with C1 or C2 respectively.

These different possible approaches (e.g., more aggressive, more conservative, weighting) provide flexibility for users to define verification criteria. These different possible approaches may facilitate pushing the limits of possible mask features (e.g., give pattern designers maximum freedom) while still preserving mask manufacturability. In some embodiments, the more aggressive, more conservative, and/or weighting approaches may be combined with verification criteria that varies as a function of curvature (e.g., as shown in FIG. 8), binning, and/or other concepts described herein.

The exact weight versus curvature dependence in the example shown in FIG. 8 is not intended to be limiting. In some embodiments, this dependence may be defined by the present systems and methods based on prior data for prior similar mask features, manually by a user (e.g., via a user interface), and/or by other methods. It should be noted that this example may be extended to any number of locations with corresponding local curvatures and determined thresholds.

Returning to FIG. 3, in some embodiments, method 300 includes adjusting 306 one or more of the features responsive to a breach of the verification criteria. Adjusting 306 may be performed based on an amount and/or type of the breach, and/or based on other information. For example, adjusting 306 may be based on an amount the spacing of two features in a mask design breaches a spacing threshold (with the spacing threshold determined based on the curvatures of corresponding segments of the two features as described above). As another example, adjusting 306 may be based on whether there is a breach of a spacing verification criteria threshold, a critical dimension verification criteria threshold, a line width verification criteria threshold, and/or other breach types.

In some embodiments, the breach is detected by (1) determining a dimension of the feature, a shape of the feature, a location of the feature in the mask design, and/or a position of the feature in the mask design relative to other features; and (2) comparing the dimension of the feature, the shape of the feature, the location of the feature in the mask design, and/or the position of the feature in the mask design relative to other features to a corresponding threshold of the verification criteria. As described herein, the corresponding threshold varies with local curvatures at locations on segments of the feature as described herein. A breach may be detected responsive to the comparison showing that the dimension of the feature, the shape of the feature, the location of the feature in the mask design, and/or the position of the feature in the mask design relative to other features breaches the corresponding threshold of the verification criteria. In some embodiments, adjusting 306 comprises changing a dimension of the feature, a shape of the feature, a location of the feature in the mask design, a position of the feature in the mask design relative to other features, and/or other adjustments.

In some embodiments, adjusting 306 comprises identifying two or more related individual segments of the feature, determining which segment or segments of the two or more related individual segments to adjust, and determining how much to adjust each one of the two or more related individual segments. In some embodiments, determining which segment or segments of the two or more related individual segments to adjust, and how much to adjust a given segment, is based on an extent to which an adjustment to an individual one of the two or more related individual segments reduces or eliminates a corresponding breach, and/or other information.

In some embodiments, adjusting 306 may comprise one or more penalty adjustments and/or other adjustments. In some embodiments, adjusting one or more segments responsive to a breach of the verification criteria may be performed to optimize a cost function. Adjustments for breaches may be treated as penalties associated with the cost function. The one or more penalty adjustments may comprise equal adjustments to each one of the two or more related individual segments, an adjustment to only one of the two or more related individual segments, or unequal adjustments to each one of the two or more related individual segments. In some embodiments, a penalty adjustment may comprise adjustment of one or more segments adjacent to one of the two or more related individual segments.

Figure 9:
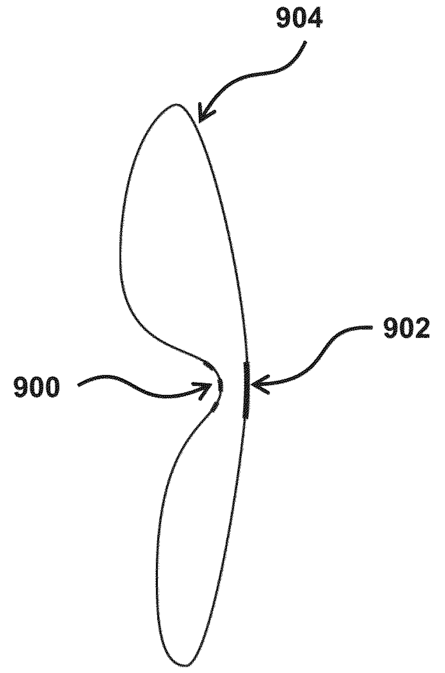
FIG. 9 illustrates identifying two or more related individual segments 900 of a feature 904, determining which segment or segments of the two or more related individual segments to adjust, and determining how much to adjust each one of the two or more related individual segments, according to an embodiment.

For example, FIG. 9 illustrates two related individual segments 900, 902 of a feature 904 which may be identified, used for determining which segment or segments 900, 902 of the two related individual segments 900, 902 to adjust, and used for determining how much to adjust each one of the two related individual segments 900, 902. Segments 900 and 902 have different local curvatures. As described above, verification criteria varies with local curvature for locations on segments 900 and 902. The verification criteria may specify pattern characteristic thresholds that vary with local curvatures. Verification criteria may be associated with segment 900 and 902 separately, and/or verification criteria may be associated with segments 900 and 902 together (e.g., two locations on two features as described above).

In some embodiments, adjusting one or more segments 900, 902 responsive to a breach of the verification criteria may be performed to optimize a cost function. As described above, adjustments for breaches may be treated as penalties associated with the cost function. The cost function may be used for determining which segment or segments of the two related individual segments 900, 902 to adjust, and for determining how much to adjust each one of the two or more related individual segments 900, 902 (e.g., in an effort to optimize the cost function). In this example, each segment 900, 902 may have different individual pattern characteristic thresholds associated with their respective local curvatures, and/or a common pattern characteristic threshold determined based on the local curvatures of both segments 900, 902.

In some embodiments, a common threshold between segments 900, 902 may be defined as described above (e.g., aggressive, conservative, weighted, binning, etc.). In some embodiments, to optimize the cost function, a common or equal penalty adjustment between segments 900, 902 may be determined and/or made (e.g., each segment may be adjusted the same amount). In some embodiments, the present systems and methods may be configured such that a user defined penalty sharing knob (e.g., a virtual knob accessible through a user interface) can be used to penalize (e.g., adjust) mask segments 900, 902 differently based on their curvature (e.g., 2D segments can be more penalized relative to 1D segments, segments with larger curvatures may be penalized more than segments with smaller curvatures, etc.). In some embodiments, an additional penalty diffusion parameter can be used to share the penalty to adjacent (same side) segments. In some embodiments, the present systems and methods are configured to facilitate penalty adjustments between segments based on a user-defined penalty weight sharing parameter directly, without computing a resolved threshold value for segments 900, 902. This can be done by sharing the local contour MRC violation cost together with the opposite mask contour segments. Accordingly, the opposite mask contour segment would react to this violation even if it does not have a violation according to its local curvature rules. The amount of cost sharing can be controlled by curvature-based weight, where some local curvatures can transfer more weights to opposite segments compared to others.

As a non-limiting example, if segment 900 individually is not in breach of verification criterial thresholds, and segment 902 is, it may be useful to share a penalty adjustment between segments 900, 902. In some embodiments, it may be useful to have the shared penalty adjustment be weighted (e.g., based on a user setting) and/or parameterized in other ways. This allows the user to control how much each segment is penalized and/or otherwise adjusted. A penalty adjustment distribution parameter may be any parameter that defines how much of a penalty adjustment is transferred to an opposite and/or otherwise related segment during a correction (adjustment) iteration, for example. In some embodiments, this penalty adjustment distribution parameter can also be a function of curvature, such that the user can control which segment gets how much of an adjustment to resolve a breach. For example, the present systems and methods may be configured to decide that segments with relatively large curvature values bear a majority of an adjustment to resolve a breach, even if it is a corresponding segment with a relatively small curvature value that is actually causing the breach. In addition, a penalty adjustment can be cascaded to nearby adjacent segments (e.g., with the same negative or positive curvature) to ensure that collectively a group segments pass the appropriate cost for cost function optimization.

Returning to FIG. 3, in some embodiments, adjusting 306 includes first determining an actual adjustment. This may be an amount or value for a dimensional change, a shape change, a spacing change, a change in curvature, etc. The determined adjustment may be used as described to adjust one or more features of a mask design. However, alternatively and/or in addition, the determined adjustment may be communicated to a different system and/or to a user, and/or used in other operations, without performing any actual adjusting. This may take the form of a recommendation and/or suggestion, for example, and/or other form. Such a recommendation and/or suggestion may be communicated to a user via a user interface, for example, electronically communicated to a different system, and/or communicated in other ways.

In some embodiments, operation 306 includes determining one or more adjustments for the mask pattern. It may also include determining corresponding adjustments of the projection optics, the illumination source, and/or other components. The pattern, the projection optics, the illumination source, and/or the other components may be adjusted until a termination condition is satisfied, for example. The termination condition may be a reduction and/or elimination of a threshold breach (as described above), and or other termination conditions. In some embodiments, the termination condition comprises a determination that features patterned onto the substrate substantially match a target design. In some embodiments, a given mask feature or features may be adjust in combination with other tunable lithography knobs to reduce and/or eliminate a threshold breach. Put another way, the mask pattern, the projection optics, the illumination source, and/or the other components may be adjusted until the dimensions, locations, and/or other properties of features patterned into a substrate (e.g., physically patterned and/or modeled) are within design tolerances for those dimension, locations, and/or other properties.

In some embodiments, adjustments may be iterative adjustments of the mask pattern, parameters of the illumination source, parameters of the projection optics, and/or other iterative adjustments, for example. The iterative adjustments may continue until the termination condition is satisfied (e.g., until one or more features patterned on a substrate adequately match a target design). In some embodiments, adjustments of the pattern include adjustments of design variables (e.g., feature dimensions, locations, etc.; adding and/or subtracting assist features; etc.). Adjustments of the parameters of the illumination source include adjustments of a dose, a wavelength, an intensity, and/or other parameters of the illumination. Adjustments of the parameters of the projection optics may include pupil adjustments, adjusting a slit, and/or other parameters of the projection optics.

In some embodiments, the iterative adjustment of the pattern, parameters of the illumination source, parameters of the projection optics, and/or other iterative adjustments until a termination condition is satisfied is performed without constraints restricting ranges of possible values of the tunable variables. In some embodiments, the iterative adjustment of the pattern, parameters of the illumination source, parameters of the projection optics, and/or other iterative adjustments until a termination condition is satisfied is performed with at least one constraint (e.g., a critical dimension, a minimum line width, a minimum spacing between curved shapes, etc.) that varies with curvature restricting a range of possible values of at least one tunable variable. In some embodiments, the at least one constraint is associated with one or more of physical characteristics of the mask and/or fabricating the mask, physical characteristics of a lithographic projection apparatus, or dependence of a design variable (e.g., curvature of a segment of a first feature) on one or more other design variables (e.g., curvature of a related segment of a second feature).

Figure 10:
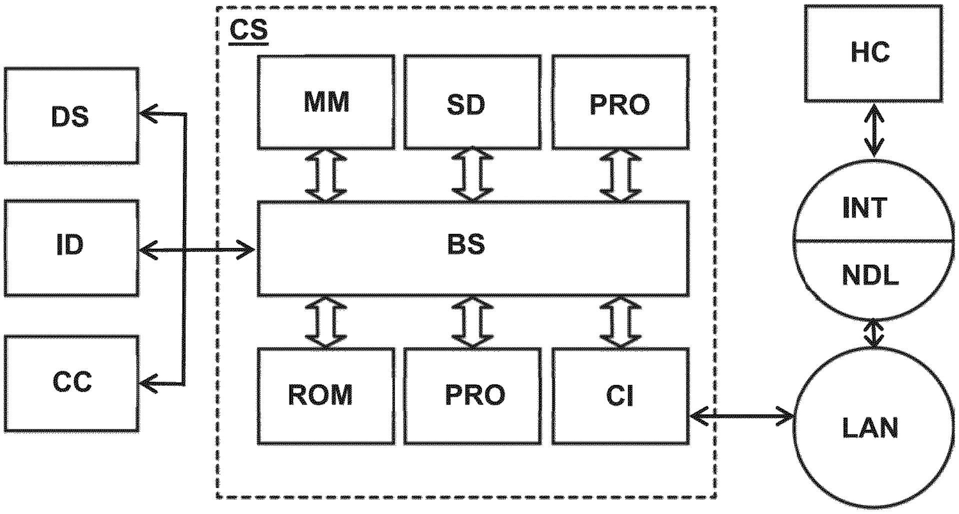
FIG. 10 is a block diagram of an example computer system, according to an embodiment.

FIG. 10 is a diagram of an example computer system CS that may be used for one or more of the operations described herein. Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions included in main memory MM causes processor PRO to perform the process steps (operations) described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the operations described herein. Transitory computer-readable media can include a carrier wave or other propagating electromagnetic signal, for example.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) may use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN, and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 11:
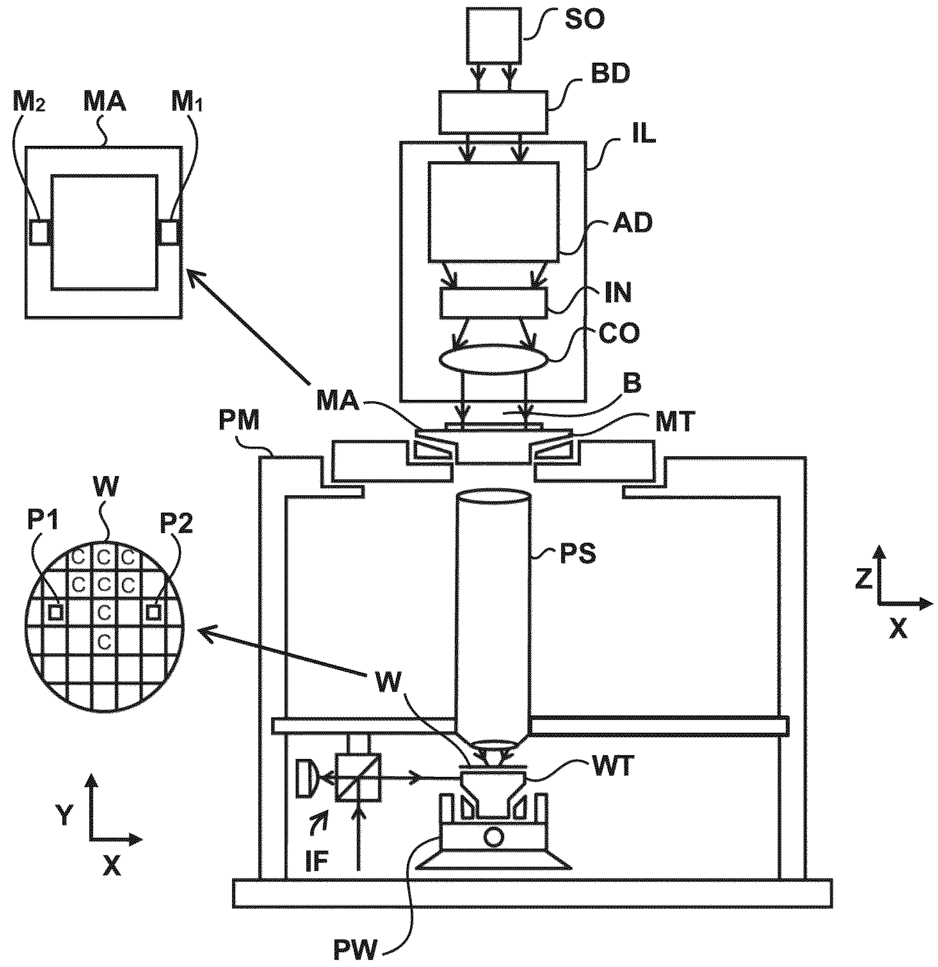
FIG. 11 is a schematic diagram of a lithographic projection apparatus, according to an embodiment.

FIG. 11 is a schematic diagram of a lithographic projection apparatus, according to an embodiment. The lithographic projection apparatus may be associated with one or more of the operations described herein. For example, a verified mask design may be used for a mask that is removably coupled with the lithographic projection apparatus. The lithographic projection apparatus can include an illumination system IL, a first object table MT, a second object table WT, and a projection system PS. Illumination system IL, can condition a beam B of radiation. In this example, the illumination system also comprises a radiation source SO. First object table (e.g., a patterning device table) MT can be provided with a patterning device holder to hold a patterning device MA (e.g., a mask or reticle), and connected to a first positioner to accurately position the patterning device with respect to item PS. Second object table (e.g., a substrate table) WT can be provided with a substrate holder to hold a substrate W (e.g., a resist-coated silicon wafer), and connected to a second positioner to accurately position the substrate with respect to item PS. Projection system (e.g., which includes a lens) PS (e.g., a refractive, catoptric or catadioptric optical system) can image an irradiated portion of the patterning device MA onto a target portion C (e.g., comprising one or more dies) of the substrate W. Patterning device MA and substrate W may be aligned using patterning device alignment marks M1, M2 and substrate alignment marks P1, P2, for example.

As depicted, the apparatus can be of a transmissive type (i.e., has a transmissive patterning device). However, in general, it may also be of a reflective type, for example (with a reflective patterning device). The apparatus may employ a different kind of patterning device for a classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander, or beam delivery system BD (comprising directing mirrors, the beam expander, etc.). for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus. The radiation beam that it produces may be led into the apparatus (e.g., with the aid of suitable directing mirrors), for example. This latter scenario can be the case when source SO is an excimer laser (e.g., based on KrF, ArF or F2 lasing), for example.

The beam B can subsequently intercept patterning device MA, which is held on a patterning device table MT. Having traversed patterning device MA, the beam B can pass through the lens PL, which focuses beam B onto target portion C of substrate W. With the aid of the second positioning means (and interferometric measuring means IF), the substrate table WT can be moved accurately, e.g. to position different target portions C in the path of beam B. Similarly, the first positioning means can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool), patterning device table MT may be connected to a short stroke actuator, or may be fixed.

The depicted tool can be used in two different modes, step mode and scan mode. In step mode, patterning device table MT is kept essentially stationary, and an entire patterning device image is projected in one operation (i.e., a single "flash") onto a target portion C. Substrate table WT can be shifted in the x and/or y directions so that a different target portion C can be irradiated by beam B. In scan mode, essentially the same scenario applies, except that a given target portion C is not exposed in a single "flash." Instead, patterning device table MT is movable in a given direction (e.g., the "scan direction", or the "y" direction) with a speed v, so that projection beam B is caused to scan over a patterning device (e.g., mask) image. Concurrently, substrate table WT is simultaneously moved in the same or opposite direction at a speed V=Mv, in which M is the magnification of the lens (typically, M=¼ or ⅕). In this manner, a relatively large target portion C can be exposed, without having to compromise on resolution.

Figure 12:
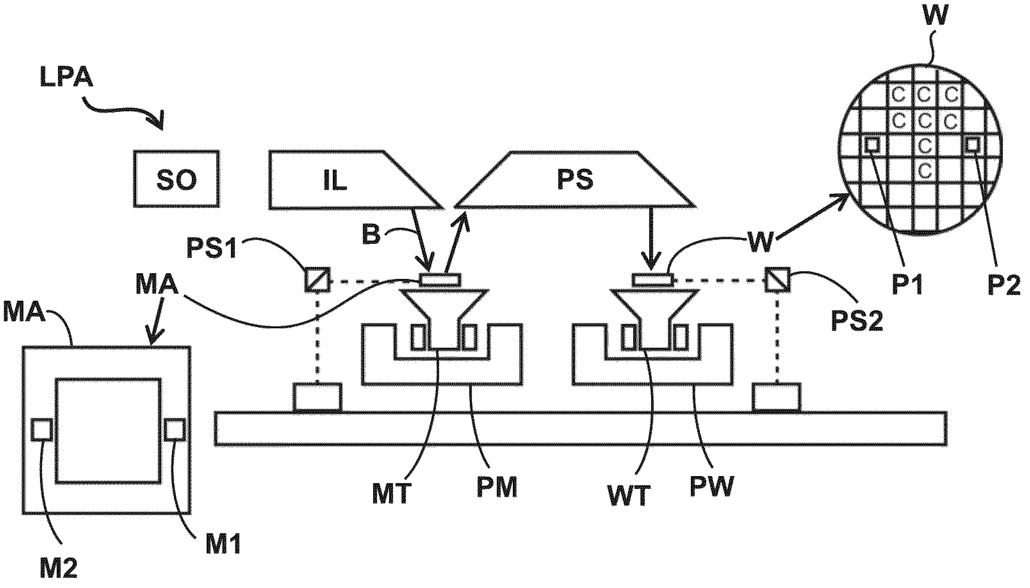
FIG. 12 is a schematic diagram of another lithographic projection apparatus, according to an embodiment.

FIG. 12 is a schematic diagram of another example lithographic projection apparatus (LPA) that may be used for, and/or in conjunction with, one or more of the operations described herein. LPA can include source collector module SO, illumination system (illuminator) IL configured to condition a radiation beam B (e.g. EUV radiation), support structure MT, substrate table WT, and projection system PS. Support structure (e.g. a patterning device table) MT can be constructed to support a patterning device (e.g. a mask or a reticle) MA and connected to a first positioner PM configured to accurately position the patterning device. Substrate table (e.g. a wafer table) WT can be constructed to hold a substrate (e.g. a resist coated wafer) W and connected to a second positioner PW configured to accurately position the substrate. Projection system (e.g. a reflective projection system) PS can be configured to project a pattern imparted to the radiation beam B by patterning device MA onto a target portion C (e.g. comprising one or more dies) of the substrate W.

As shown in this example, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP"), the plasma can be produced by irradiating a fuel, such as a droplet, stream or cluster of material having the line-emitting element, with a laser beam. Source collector module SO may be part of an EUV radiation system including a laser (not shown in FIG. 12), for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation. In this example, the laser may not be considered to form part of the lithographic apparatus and the radiation beam can be passed from the laser to the source collector module with the aid of a beam delivery system comprising, for example, suitable directing mirrors and/or a beam expander. In other examples, the source may be an integral part of the source collector module, for example when the source is a discharge produced plasma EUV generator, often termed a DPP source.

Illuminator IL may comprise an adjuster for adjusting the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder, or capacitive sensor), the substrate table WT can be moved accurately (e.g. to position different target portions C in the path of radiation beam B). Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode. In step mode, the support structure (e.g. patterning device table) MT and the substrate table WT are kept essentially stationary, while an entire pattern imparted to the radiation beam is projected onto a target portion C at one time (e.g., a single static exposure). The substrate table WT is then shifted in the X and/or Y direction so that a different target portion C can be exposed. In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de)magnification and image reversal characteristics of the projection system PS. In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 13:
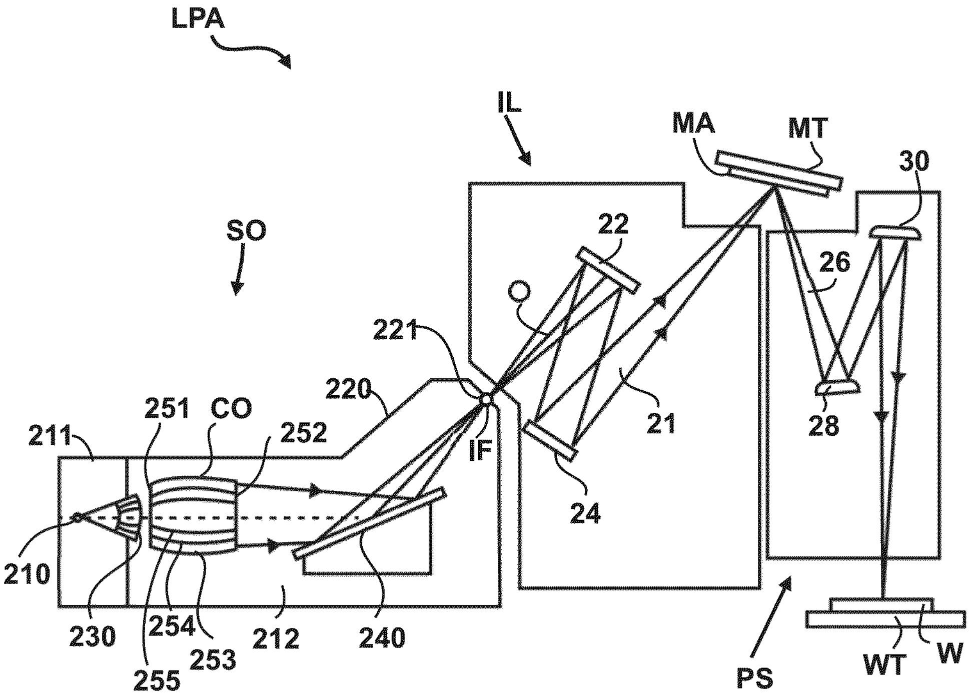
FIG. 13 is a detailed view of a lithographic projection apparatus, according to an embodiment.
Figure 14:
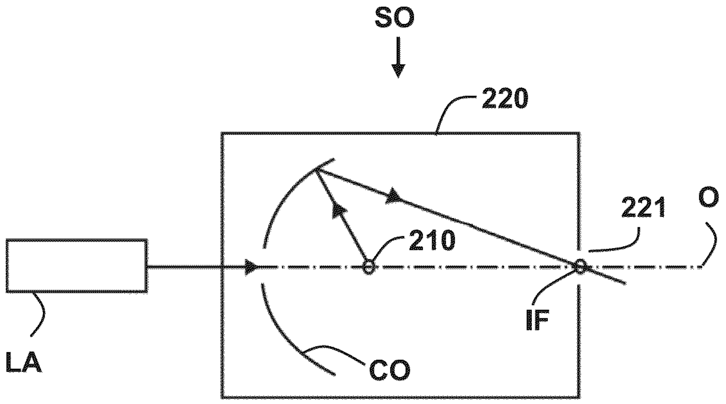
FIG. 14 is a detailed view of the source collector module of the lithographic projection apparatus, according to an embodiment.

FIG. 13 is a more detailed view of the lithographic projection apparatus shown in FIG. 14. As shown in FIG. 13, the LPA can include the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 (described below) also includes a channel structure. The collector chamber 211 may include a radiation collector CO which may be a grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the line "O". The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT. More elements than shown may generally be present in illumination optics unit IL and projection system PS. The grating spectral filter 240 may optionally be present, depending upon the type of lithographic apparatus, for example. Further, there may be more mirrors present than those shown in the figures, for example there may be 1-6 additional reflective elements present in the projection system PS than shown in FIG. 13.

Collector optic CO, as illustrated in FIG. 13, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

FIG. 14 is a detailed view of source collector module SO of the lithographic projection apparatus LPA (shown in previous figures). Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10"s of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Embodiments of the present disclosure can be further described by the following clauses.

1. A method for adjusting a feature of a mask design, the method comprising:
   - determining localized shapes of the feature;
   - determining whether there is a breach by the feature of verification criteria based on the localized shapes, wherein the verification criteria specifies correspondence between a threshold of a pattern characteristic and a localized shape; and adjusting the feature based on a detected breach.

2. The method of clause 1, wherein the adjusting comprises changing a dimension of the feature, a shape of the feature, a location of the feature in the mask design, and/or a position of the feature in the mask design relative to other features.

3. The method of clauses 1 or 2, wherein the localized shapes comprise local curvatures of individual locations on segments of the feature.

4. The method of clause 3, wherein determining the local curvatures comprises performing curve fitting on the segments, and/or determining local angle deviations of the segments.

5. The method of any of clauses 3-4, wherein the threshold of the pattern characteristic is a spacing threshold, and wherein the verification criteria specifies the spacing threshold as a function of the local curvatures.

6. A method for verifying a feature of a mask design, the method comprising:
   - determining localized shapes of the feature; and
   - determining whether there is a breach by the feature of verification criteria based on the localized shapes, wherein the verification criteria specifies correspondence between a threshold of a pattern characteristic and a localized shape.

7. The method of clause 6, wherein the localized shapes comprise local curvatures of individual locations on segments of the feature.

8. The method of clause 7, wherein determining the local curvatures comprises performing curve fitting on individual segments, and/or determining local angle deviations of the individual segments.

9. The method of any of clauses 7-8, wherein the threshold of the pattern characteristic is a spacing threshold, and wherein the verification criteria specifies the spacing threshold as a function of the local curvatures.

10. The method of any of clauses 7-9, further comprising binning similar local curvatures into bins, and determining different verification criteria for different bins.

11. The method of any of clauses 7-10, further comprising identifying two locations on the feature or two locations on different features, and determining the threshold of the pattern characteristic between the two locations based on local curvatures of the locations.

12. The method of clause 11, wherein the threshold of the pattern characteristic between the two locations is a spacing threshold, and wherein determining the spacing threshold between the two locations comprises:
   - determining a first threshold based on a local curvature of a first location;
   - determining a second threshold based on a local curvature of a second location; and/or
   - determining a weighted combination of the first threshold and the second threshold.

13. The method of any of clauses 6-12, wherein the pattern characteristic comprises a minimum line width, a critical dimension, or a minimum spacing between curved shapes.

14. The method of any of clauses 6-13, wherein the feature of the mask design is a freeform curvilinear mask feature.

15. The method of any of clauses 6-14, further comprising, responsive to a breach by the feature of the verification criteria; adjusting the feature based on the breach.

16. The method of clause 15, wherein the breach is detected by (1) determining a dimension of the feature, a shape of the feature, a location of the feature in the mask design, and/or a position of the feature in the mask design relative to other features; and (2) comparing the dimension of the feature, the shape of the feature, the location of the feature in the mask design, and/or the position of the feature in the mask design relative to other features to a corresponding threshold of the verification criteria.

17. The method of any of clauses 15-16, wherein the adjusting comprises changing a dimension of the feature, a shape of the feature, a location of the feature in the mask design, and/or a position of the feature in the mask design relative to other features.

18. The method of any of clauses 15-17, wherein the adjusting comprises identifying two or more related individual segments of the feature, determining which segment or segments of the two or more related individual segments to adjust, and determining how much to adjust each one of the two or more related individual segments.

19. The method of clause 18, wherein determining which segment or segments of the two or more related individual segments to adjust, and how much to adjust a given segment, is based on an extent to which an adjustment to an individual one of the two or more related individual segments reduces or eliminates a corresponding breach.

20. The method of any of clauses 18-19, wherein the adjusting comprises one or more penalty adjustments, the one or more penalty adjustments comprising equal adjustments to each one of the two or more related individual segments, an adjustment to only one of the two or more related individual segments, or unequal adjustments to each one of the two or more related individual segments.

21. A non-transitory computer readable medium having instructions thereon, the instructions when executed by a computer causing the computer to:

determine localized shapes of a feature of a mask design; and determine whether there is a breach by the feature of verification criteria based on the localized shapes, wherein the verification criteria specifies correspondence between a threshold of a pattern characteristic and a localized shape.

22. The medium of clause 21, wherein the localized shapes comprise local curvatures of individual locations on segments of the feature.

23. The medium of clause 22, wherein determining the local curvatures comprises performing curve fitting on individual segments, and/or determining local angle deviations of the individual segments.

24. The medium of any of clauses 22-23, wherein the threshold of the pattern characteristic is a spacing threshold, and wherein the verification criteria specifies the spacing threshold as a function of the local curvatures.

25. The medium of any of clauses 22-24, wherein the instructions are further configured to cause the computer to bin similar local curvatures into bins, and determine different verification criteria for different bins.

26. The medium of any of clauses 22-25, wherein the instructions are further configured to cause the computer to identify two locations on the feature or two locations on different features, and determine the threshold of the pattern characteristic between the two locations based on local curvatures of the locations.

27. The medium of clause 26, wherein the threshold of the pattern characteristic between the two locations is a spacing threshold, and wherein determining the spacing threshold between the two locations comprises:

determining a first threshold based on a local curvature of a first location;

determining a second threshold based on a local curvature of a second location; and/or determining a weighted combination of the first threshold and the second threshold.

28. The medium of any of clauses 21-27, wherein the pattern characteristic comprises a minimum line width, a critical dimension, or a minimum spacing between curved shapes.

29. The medium of any of clauses 21-28, wherein the feature of the mask design is a freeform curvilinear mask feature.

30. The medium of any of clauses 21-29, wherein the instructions are further configured to cause the computer to, responsive to a breach of the verification criteria by the feature; adjust the feature based on the breach.

31. The medium of clause 30, wherein the breach is detected by (1) determining a dimension of the feature, a shape of the feature, a location of the feature in the mask design, and/or a position of the feature in the mask design relative to other features; and (2) comparing the dimension of the feature, the shape of the feature, the location of the feature in the mask design, and/or the position of the feature in the mask design relative to other features to a corresponding threshold of the verification criteria.

32. The medium of any of clauses 30-31, wherein the adjusting comprises changing a dimension of the feature, a shape of the feature, a location of the feature in the mask design, and/or a position of the feature in the mask design relative to other features.

33. The medium of any of clauses 30-32, wherein the adjusting comprises identifying two or more related individual segments of the feature, determining which segment or segments of the two or more related individual segments to adjust, and determining how much to adjust each one of the two or more related individual segments.

34. The medium of clause 33, wherein determining which segment or segments of the two or more related individual segments to adjust, and how much to adjust a given segment, is based on an extent to which an adjustment to an individual one of the two or more related individual segments reduces or eliminates a corresponding breach.

35. The medium of any of clauses 33-34, wherein the adjusting comprises one or more penalty adjustments, the one or more penalty adjustments comprising equal adjustments to each one of the two or more related individual segments, an adjustment to only one of the two or more related individual segments, or unequal adjustments to each one of the two or more related individual segments.

While the concepts disclosed herein may be used for imaging on a substrate such as a silicon wafer, it shall be understood that the disclosed concepts may be used with any type of lithographic imaging systems, e.g., those used for imaging on substrates other than silicon wafers. In addition, the combination and sub-combinations of disclosed elements may comprise separate embodiments. For example, determining enhanced MRC criteria may comprise its own separate embodiment, or it may be included with one or more other embodiments that also include performing the actual check, as described herein.

The descriptions above are intended to be illustrative, not limiting. Thus, it will be apparent to one skilled in the art that modifications may be made as described without departing from the scope of the claims set out below.

The invention claimed is:

1. A non-transitory computer readable medium having instructions therein, the instructions, when executed by a computer system, configured to cause the computer system to at least:

determine localized shapes of one or more edges or contours of a feature of a mask design; and determine whether there is a breach by the feature of verification criteria based on assessment of the localized shapes against verification criteria, wherein the verification criteria specifies correspondence between a threshold of a pattern characteristic and a characteristic of a localized shape.

2. The medium of claim 1, wherein the localized shapes comprise local curvatures of individual locations on segments of the feature.

3. The medium of claim 2, wherein the instructions configured to determine the localized shapes are further configured to cause the computer system to perform curve fitting on individual segments of the feature, and/or determine local angle deviations of individual segments of the feature.

4. The medium of claim 2, wherein the threshold of the pattern characteristic comprises a spacing threshold, and wherein the verification criteria specifies the spacing threshold as a function of the local curvatures.

5. The medium of claim 2, wherein the instructions are further configured to cause the computer system to bin similar local curvatures into bins, and determine different verification criteria for different bins.

6. The medium of claim 2, wherein the instructions are further configured to cause the computer system to identify two locations on the feature or two locations corresponding to a location on the feature and another location on another different feature, and determine the threshold of the pattern characteristic between the two locations based on local curvatures of the locations.

7. The medium of claim 6, wherein the threshold of the pattern characteristic between the two locations comprises a spacing threshold, and wherein the instructions are further configured to cause the computer system to:

determine a first threshold based on a local curvature of a first location of the two locations;

determine a second threshold based on a local curvature of a second location of the two locations; and/or determine a weighted combination of the first threshold and the second threshold.

8. The medium of claim 1, wherein the pattern characteristic comprises a minimum line width, a critical dimension, or a minimum spacing between curved shapes.

9. The medium of claim 1, wherein the feature of the mask design is a freeform curvilinear mask feature.

10. The medium of claim 1, wherein the instructions are further configured to cause the computer system to, responsive to a breach of the verification criteria by the feature, adjust the feature based on the breach.

11. The medium of claim 10, wherein the instructions are further configured to cause the computer system to detect breach by the feature of verification criteria is detected by (1) determination of a dimension of the feature, of a shape of the feature, of a location of the feature in the mask design, and/or of a position of the feature in the mask design relative to one or more other features in the mask design; and (2) comparison of the dimension of the feature, the shape of the feature, the location of the feature in the mask design, and/or the position of the feature in the mask design relative to other features to a corresponding threshold of the verification criteria.

12. The medium of claim 10, wherein the instructions configured to adjust the feature are further configured to cause the computer system to change a dimension of the feature, a shape of the feature, a location of the feature in the mask design, and/or a position of the feature in the mask design relative to one or more other features in the mask design.

13. The medium of claim 10, wherein the instructions configured to adjust the feature are further configured to cause the computer system to identify two or more related individual segments of the feature, determine which segment or segments of the two or more related individual segments to adjust, and determine how much to adjust each one of the two or more related individual segments.

14. The medium of claim 13, wherein the instructions configured to determine which segment or segments of the two or more related individual segments to adjust, and how much to adjust a given segment, are configured to do so based on an extent to which an adjustment to an individual one of the two or more related individual segments reduces or eliminates a corresponding breach.

15. The medium of claim 14, wherein the instructions configured to adjust the feature are configured to do so using one or more penalty adjustments, the one or more penalty adjustments comprising equal adjustments to each one of the two or more related individual segments, an adjustment to only one of the two or more related individual segments, or unequal adjustments to each one of the two or more related individual segments.

16. A method for adjusting a feature of a mask design, the method comprising:

determining, by a hardware computer, localized shapes of one or more edges or contours of the feature; and determining whether there is a breach by the feature of verification criteria based on assessment of the localized shapes against verification criteria, wherein the verification criteria specifies correspondence between a threshold of a pattern characteristic and a characteristic of a localized shape.

17. The method of claim 16, further comprising, based on a result of determining whether there is a breach by the feature of verification criteria, changing a dimension of the feature, a shape of the feature, a location of the feature in the mask design, and/or a position of the feature in the mask design relative to one or more other features in the mask design.

18. The method of claim 16, wherein the localized shapes comprise local curvatures of individual locations on segments of the feature.

19. The method of claim 18, wherein the determining localized shapes comprises determining the local curvatures by performing curve fitting on the segments, and/or determining local angle deviations of the segments.

20. The method of claim 16, further comprising adjusting, by a hardware computer, the feature based on a result of determining whether there is a breach by the feature of verification criteria.

* * * * *